United States Patent
Ohshima et al.

(10) Patent No.: US 6,469,352 B2
(45) Date of Patent: Oct. 22, 2002

(54) TWO-TERMINAL SEMICONDUCTOR OVERCURRENT LIMITER

(75) Inventors: Kunihito Ohshima; Masaya Shirota; Toshikazu Tezuka, all of Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/884,057

(22) Filed: Jun. 20, 2001

(65) Prior Publication Data

US 2002/0000568 A1 Jan. 3, 2002

(30) Foreign Application Priority Data

Jun. 30, 2000 (JP) ........................................ 2000-198415

(51) Int. Cl.$^7$ .............................................. H01L 23/62
(52) U.S. Cl. ........................................ 257/355; 257/401
(58) Field of Search ................................ 257/335–345, 257/255, 360, 355; 438/133, 234

(56) References Cited

U.S. PATENT DOCUMENTS

| | | | | |
|---|---|---|---|---|
| 4,992,844 A | * | 2/1991 | Yakushiji | 357/38 |
| 5,304,802 A | * | 4/1994 | Kumagai | 257/133 |
| 5,550,701 A | * | 8/1996 | Nadd et al. | 257/355 |
| 5,903,028 A | | 5/1999 | Quoirin et al. | |
| 6,107,664 A | * | 8/2000 | Quoirin et al. | 257/355 |

FOREIGN PATENT DOCUMENTS

JP  11-97623  4/1999

OTHER PUBLICATIONS

J.L. Sanchez, Ph. Lecturcq, P. Austin, R. Berriane, M. Breil, C. Anceau and C. Ayela, "Design and fabrication of new high voltage current limiting devices for serial protection applications". IEEE, 1996, pp. 201–205.

J.L. Sanchez, M. Breil, P. Austin, J.P. Laur, J. Jalade, B. Rousset, H. Foch, "A new high voltage integrated switch: the <<Thyristor Dual>> function", IEEE, 1999, pp. 157–160.

J.P. Laur, J.L. Sanchez, M. Marmouget, P. Austin, J. Jalade, M. Breil, M. Roy, "A new circuit–breaker integrated device for protection applications", IEEE, 1999, pp. 315–318.

J.L. Sanchez, P. Austin, R. Berraine, M. Marmouget, "Trends in design and technology for new power integrated devices based on functional integration", EPE'97, 1997, pp. 1302–1307.

* cited by examiner

*Primary Examiner*—David Nelms
*Assistant Examiner*—Long K. Tran
(74) *Attorney, Agent, or Firm*—Bacon & Thomas

(57) ABSTRACT

A semiconductor overcurrent limiter having input and output terminals includes a depletion type vertical MOSFET, a depletion type lateral MOSFET, and a zener diode. A back gate of the lateral MOSFET is formed in common with a drain electrode of the vertical MOSFET to provide the input terminal, and a gate of the vertical MOSFET is connected to an anode of the zener diode to provide the output terminal. Further, a source electrode of the vertical MOSFET is connected to source and gate electrodes of the lateral MOSFET and a cathode electrode of the zener diode.

8 Claims, 2 Drawing Sheets

TWO-TERMINAL SEMICONDUCTOR OVERCURRENT LIMITER

CROSS-REFERENCE TO RELATED APPLICATIONS

This application is based upon and claims the benefit of priority from the prior Japanese Patent Application No. 2000-198415, filed Jun. 30, 2000, the entire contents of which are incorporated herein by reference.

BACKGROUND OF THE INVENTION

1. Field of the Invention

This invention relates to a two-terminal semiconductor overcurrent limiter which protects an electric load such as electronic devices from unwanted breakdown even if an overcurrent flows therethrough.

2. Description of the Related Art

For protecting the electric load from the breakdown by the overcurrent flowing therethrough, it has been carried out that a circuit breaker is connected in series with the electric load to break the overcurrent electromechanically. However, after the overcurrent is once broken, the circuit breaker must be operated for restoring it to an original condition. Further, since the circuit breaker is large, it would not be provided in the form of integrated circuits.

For applying such a protection device to an integrated circuit, a semiconductor overcurrent limiter incorporating semiconductor elements has been proposed. In such a semiconductor device, a voltage drop due to the overcurrent is detected, and the overcurrent is broken by a gate voltage when it flows therethrough. As this example, Jpn. Pat. Appln. KOKAI Publication No. 11-97623 Published on Apr. 9, 1999 discloses a protection device for electric overload and a power supply circuit having the protection device. However, the device has a disadvantage such that the overcurrent flows therethrough because it is not instantaneously broken.

Further, the overcurrent protection device having two terminals 31 and 32, disclosed in Jpn. Pat. Appln. KOKAI No. 11-97623, is provided by three MOSFETs 33 to 35 and one zener diode 36 as shown in FIG. 5. However, since the protection device has a comparatively moderate break characteristic as shown in FIG. 4, it can not respond to a rapid change in the overcurrent. Therefore, the device to be protected will be heated and broken.

BRIEF SUMMARY OF THE INVENTION

Therefore, an object of the present invention is to provide a semiconductor overcurrent limiter having two terminals capable of instantaneously breaking an overcurrent flowing through an electric load connected in series therewith.

Another object of the present invention is to provide an integrated semiconductor overcurrent limiter having a high breakdown voltage.

Further object of the present invention is to provide a semiconductor overcurrent limiter for protecting an electric load connected in series therewith when a predetermined current flows therethrough to increase its impedance.

According to one aspect of the present invention, there is provided a two-terminal semiconductor overcurrent limiter, which comprises a semiconductor substrate having first and second surfaces; a vertical MOSFET, provided in the semiconductor substrate, having first source and gate electrodes disposed on the first surface, and a first drain electrode disposed on the second surface to provide a first terminal; a lateral MOSFET, provided in the semiconductor substrate and connected in series with the vertical MOSFET, having second source, drain and gate electrodes disposed on the first surface, and a back gate electrode provided on the second surface in common with the first drain electrode; and a zener diode, provided in the first surface, having an anode electrode connected to the first gate electrode and formed in common with the second drain electrode to provide a second terminal, and a cathode electrode connected to both the second source electrode and the second gate electrode.

In this case, the vertical and lateral MOSFETs having a depletion mode are employed, and the vertical MOSFET has a first conductivity type while the lateral MOSFET has a second conductivity type.

Since the lateral MOSFET has a shallow channel region, a current or overcurrent flowing through the second conductivity type lateral MOSFET is controlled and interrupted due to a voltage drop there across by a voltage applied to the back gate, with the result that a gate voltage of the first conductivity type vertical MOSFET is increased above a threshold voltage, thereby breaking the current flowing therethrough.

The first conductivity type vertical MOSFET is a high voltage MOSFET having a high breakdown voltage to break or interrupt the current. An insulated gate bipolar transistor may also be employed.

The zener diode can be produced at the same time with the lateral MOSFET in the process of making the semiconductor overcurrent limiter. Therefore, the zener diode has a breakdown voltage which is similar to or lower than that of the second conductivity type lateral MOSFET, thereby protecting gate structures of lateral and vertical MOSFETs when a high voltage is applied to the overcurrent limiter.

Still further, according to the overcurrent limiter, two MOSFETs and the zener diode are provided in the semiconductor substrate so that the anode electrode/the back gate electrode and the cathode electrode/anode of the zener diode are formed in common respectively. Therefore, compact overcurrent limiters can be obtained, and the fabrication cost can also be reduced because semiconductor elements are formed by the same diffusion process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiment

Figure 1:
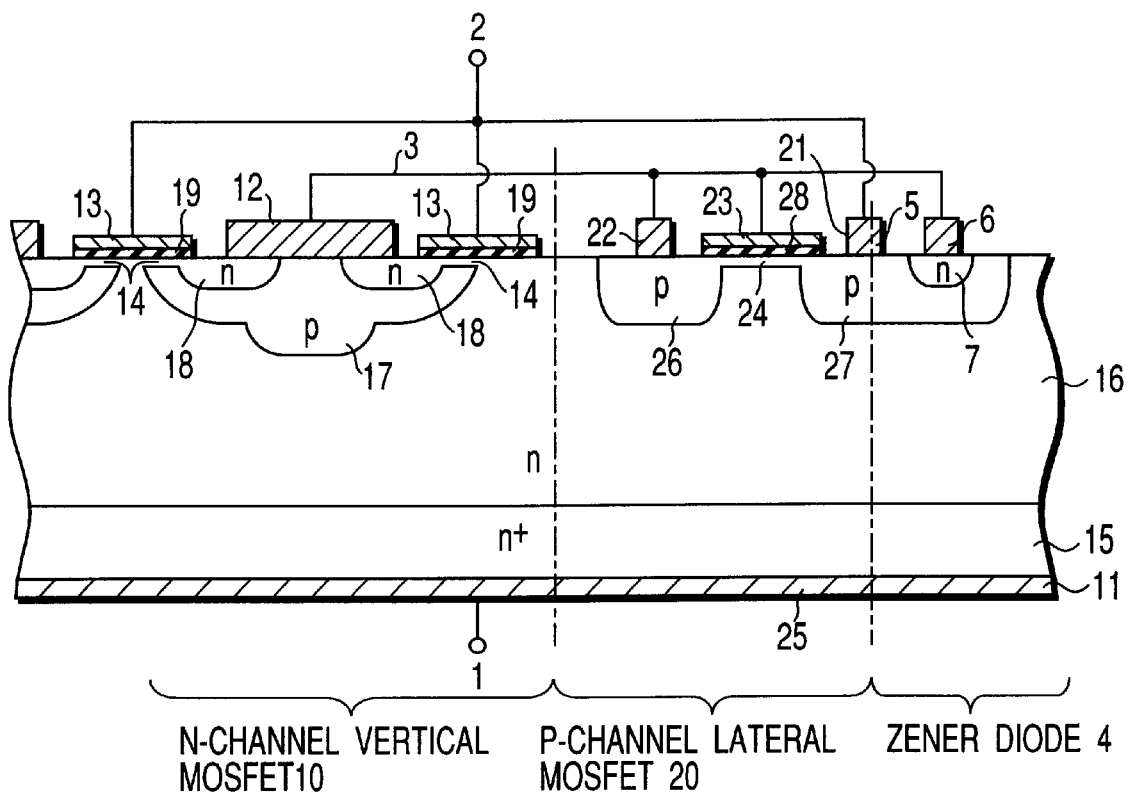
FIG. 1 is a cross-sectional view showing a two-terminal semiconductor overcurrent limiter according to an embodiment of the present invention.

Referring to FIG. 1, there is shown a semiconductor overcurrent limiter according to an embodiment of the present invention.

The semiconductor overcurrent limiter comprises a depletion type n-channel vertical field effect transistor 10 (hereinafter denoted by vertical MOSFET 10), a depletion type p-channel lateral field effect transistor 20 (hereinafter denoted by lateral MOSFET 20), and a zener diode 4, which are provided in a semiconductor substrate formed of an n-type semiconductor layer 16 having an n+-type layer 15.

The vertical MOSFET 10 includes a p-type region 17 provided in the n-type semiconductor layer 16, an n-type source region 18 formed in the p-type region 17, an n-channel region 14 provided between the n-type semiconductor layer 16 and the n-type source region 18, a source electrode 12 provided on the source region 18 so as to cover the exposed surface of the p-type region 17, a gate electrode 13 provided on a gate insulating film to cover the n-channel region 14, and a drain electrode 11 in contact with the n+-type layer 15 acting as a drain region of the vertical MOSFET 10.

On the other hand, the lateral MOSFET 20 includes p-type source and drain regions 26, 27 formed in the n-type semiconductor layer 16, a p-channel region 24 provided between the source and drain regions 26, 27, a drain electrode 21 provided on the drain region 27, a source electrode 22 provided on the source region 26, a gate electrode 23 provided on a gate insulating film to cover the p-channel region 24, and a back gate electrode 25 formed on the n+-type layer 15.

The zener diode 4 is provided by forming an n-type region 7 in the p-type drain region 27. In the zener diode, the drain electrode 21 is used as an anode electrode, and an electrode 6 provided on the n-type region 7 is employed as a cathode electrode.

As is apparent from FIG. 1, the drain electrode 11 of the vertical MOSFET 10 and the back gate electrode 25 of the lateral MOSFET 20 are given by a common metallization, that is, they are electrically connected to provide an input terminal (anode terminal) 1. Further, the source electrode 12 of the vertical MOSFET 10, the source and gate electrodes 22, 23 of the lateral MOSFET 20 and the cathode electrode 6 of the zener diode 4 are connected to one another to provide a connection node 3.

Still further, the gate electrode 13 of the MOSFET 10, the drain electrode 21 of the lateral MOSFET 20 and the anode electrode 5 of the zener diode 4 are electrically connected to provide an output terminal (cathode terminal) 2.

Figure 2:
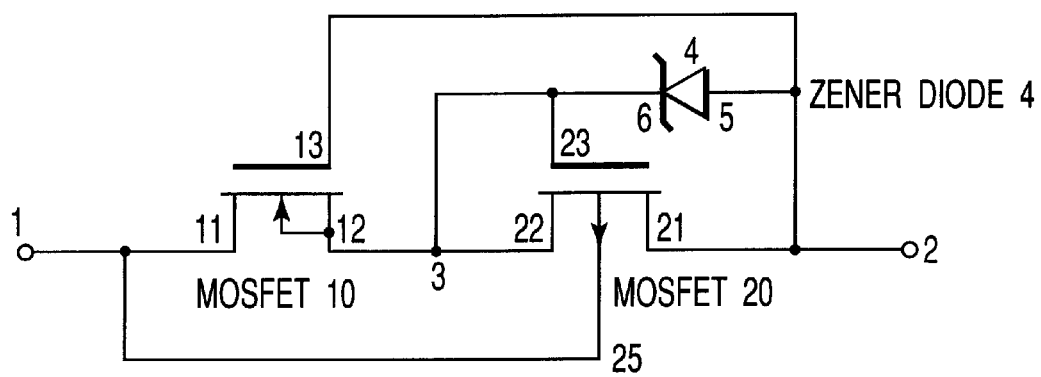
FIG. 2 is an equivalent circuit of the semiconductor overcurrent limiter shown in FIG. 1.

FIG. 2 shows an equivalent circuit of the semiconductor overcurrent limiter shown in FIG. 1.

As described above, the source electrode 12 of the vertical MOSFET 10 is connected to the source electrode 22 of the lateral MOSFET 20 between the terminals 1 and 2. That is, the vertical MOSFET 10 and the lateral MOSFET 20 are connected in series, while the zener diode 4 is connected in parallel with the lateral MOSFET 20. The anode electrode 5 of the zener diode 4 is connected to the drain electrode 21 of the lateral MOSFET 20, and is further connected to the gate electrode 13 of the vertical MOSFET 10. The cathode electrode 6 of the zener diode 4 is connected to the source electrode 12 of the vertical MOSFET 10 and the source and gate electrodes 22, 23 of the lateral MOSFET 20, that is, it is connected to the connection node 3.

Next, the operation of the two-terminal semiconductor overcurrent limiter will be described.

Since the n-channel vertical MOSFET 10 and the p-channel lateral MOSFET 20 have a depletion mode, their gate threshold voltages have negative and positive values, respectively. Therefore, their MOSFETs 10 and 20 are on-state when a voltage between respective gate and source electrodes is zero, whereby a current flows therethrough till the voltage between the gate and source electrodes exceeds its threshold voltage. As the gate threshold of the vertical MOSFET 10 is negative, a current does not flow between the drain electrode 11 and the source electrode 12 to become an off-state when the gate voltage exceeds the threshold, thereby keeping the high breakdown voltage thereof owing to the vertical structure.

The lateral MOSFET 20 having a high on-resistance, as compared with the vertical MOSFET 10, is used. Therefore, with increase of an electric potential at the input terminal 1, the electric potential at the connection node 3 rises with a potential value which is near the electric potential of the input terminal 1. At the same time, the electric potential of the connection node 3 is applied between the gate electrode 13 and the source electrode 12 as a negative voltage.

When the electric potential of the connection node 3 rises whereby the voltage between the gate electrode 13 and the source electrode 12 of the vertical MOSFET 10 exceeds the threshold voltage, the vertical MOSFET 10 becomes an off-state to control increasing the electric potential of the connection node 3. Accordingly, the voltage between the gate electrode 13 and the source electrode 12 receives feedback, so that the vertical MOSFET 10 shows a saturated characteristic at a certain value to become a constant current operation.

Since the electric potential of the connection node 3 is saturated by the operation of the vertical MOSFET 10, a constant voltage is applied between the drain electrode 21 and the source electrode 22 of the lateral MOSFET 20. Further, as the gate electrode 23 and the source electrode 22 of the lateral MOSFET 20 are short-circuited, the voltage therebetween shows a saturated characteristic at zero volt.

The connection node 3 is controlled to a constant electric potential by the operation of the vertical MOSFET 10. However, when the electric potential of the connection node 3 is further increased to exceed the breakdown voltage of zener diode 4, it is kept at the breakdown voltage thereof. The operation of zener diode protects both the lateral and vertical MOSFETs 20, 10 from increasing the voltage between the drain electrode 21 and the source electrode 22, and the voltage between the gate electrode 23 and the source electrode 22 of the lateral MOSFET 20, and further the voltage between the gate electrode 13 and the source electrode 12 of the vertical MOSFET 10. Therefore, the voltage applied to the semiconductor overcurrent limiter is mainly applied to the vertical MOSFET 10, to which the breakdown voltage is assigned.

The electric potential of the connection node 3 responds quickly to the anode voltage applied to the input terminal 1 of the overcurrent limiter because the lateral MOSFET 20 has the relatively high on-resistance compared with the vertical MOSFET 10 as described above. When a current flows through the overcurrent limiter, a voltage drop is produced by the on-resistance of the lateral MOSFET 20 to provide a negative bias voltage there across, thereby reducing the gate voltage of the vertical MOSFET 10. When the lateral MOSFET 20 is broken, the negative bias voltage is applied to the gate electrode 13 of the vertical MOSFET 10, thereby breaking it. That is, the negative bias voltage is applied between the gate electrode 13 and the source electrode 12 of the vertical MOSFET 10. When the voltage between the gate electrode 13 and the source electrode 12 approaches the threshold voltage, the drain current flowing through the vertical MOSFET 10 is limited to saturate the current flowing through the overcurrent limiter.

The voltage between the gate electrode 23 and the source electrode 22 is zero volt because they are short-circuited to each other. However, the voltage between the drain electrode 21 and the source electrode 22 becomes equal to that between the gate electrode 23 and the drain electrode 21 because the lateral MOSFET 20 is the depletion type, whereby the gate electrode 23 carries out the off-operation. However, as the gate electrode 23 is connected to the connection node 3, the lateral MOSFET 20 shows only the saturated characteristic when the electric potential of the connection node 3 becomes constant. In the case where the threshold voltage of the vertical MOSFET 10 is higher than the saturated voltage of the connection node 3, the lateral MOSFET 20 is not operated. Therefore, the electric potential of the connection node 3 is set to be higher than the threshold of the vertical MOSFET 10 to provide good breaking effect.

Further, so far as the electric potential of the connection node 3 rises, the overcurrent is saturated but is not broken. Therefore, since the threshold of the back gate 25 of the lateral MOSFET 20 is approximately equal to that of the overcurrent limiter, it is effective for breaking the current to turn off the overcurrent limiter that the channel region 24 is shallow and the electric potential of the back gate 25 is increased.

That is, the breaking characteristic of the overcurrent limiter depends greatly upon the channel region 24 of the lateral MOSFET 20. As the channel region 24 becomes deep, an off-function due to the gate electrode 23 is reduced, and the off-function due to the back gate 25 is also decreased, thereby deteriorating the breaking effect of the overcurrent limiter.

Similarly, when the channel region 14 of the vertical MOSFET 10 is deep, unwanted leakage current is increased at the off-state, and breakdown occurs. Therefore, it is necessary to make the channel region 14 as shallow as possible in order to obtain a desired breakdown voltage.

Figure 3:
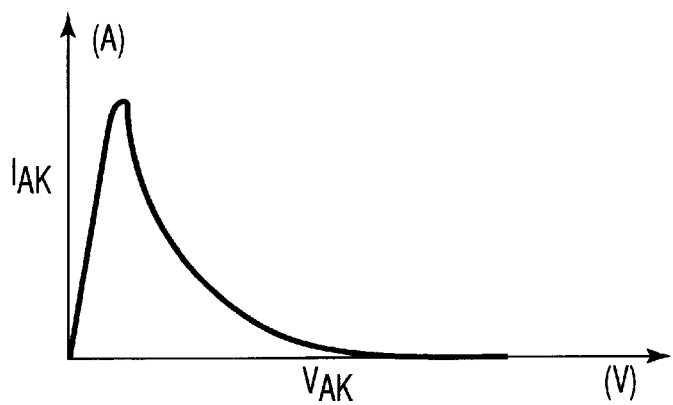
FIG. 3 shows a voltage $V_{AK}$-current $I_{AK}$ characteristic of the semiconductor overcurrent limiter.
Figure 4:
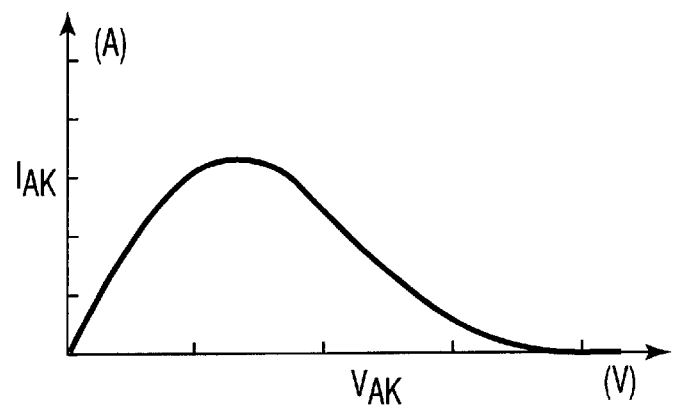
FIG. 4 shows a voltage $V_{AK}$-current $I_{AK}$ characteristic of a conventional semiconductor overcurrent limiter.
Figure 5:
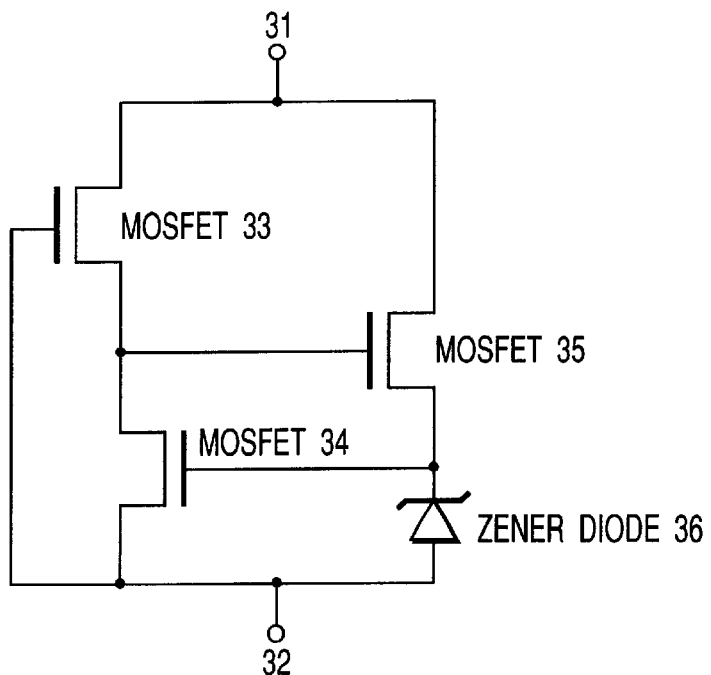
FIG. 5 is an equivalent circuit of the conventional semiconductor overcurrent limiter.

FIG. 3 shows a voltage $V_{AK}$-current $I_{AK}$ characteristic of the semiconductor overcurrent limiter, namely a breaking characteristic thereof. As compared to the conventional breaking characteristic shown in FIG. 4, the overcurrent is rapidly controlled and limited when it exceeds a certain value. Therefore, unwanted electric power due to the overcurrent is not supplied to the electric load to prevent heating and breakdown thereof.

The embodiment is one example, and it is apparent that the n-type region and the p-type region are interchanged, resulting in similar advantages. According to the present invention, as described above, the semiconductor overcurrent limiter is provided which includes the n-channel vertical MOSFET 10, the p-channel lateral MOSFET 20 and the zener diode 4 having the monolithic structure. The vertical MOSFET 10 and the lateral MOSFET 20 are connected in series, and the voltage drop, which is caused by controlling the back gate of the lateral MOSFET 20, is applied to the gate electrode 13 of the vertical MOSFET 10, thereby breaking the overcurrent flowing through the limiter, and further the gate structures of the lateral and vertical MOSFETs are protected by the zener diode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor overcurrent limiter having first and second terminals comprising a semiconductor substrate having first and second surfaces;

a vertical MOSFET, provided in said semiconductor substrate, having first source and gate electrodes, disposed on said first surface, and a first drain electrode disposed on said second surface to provide said first terminal;

a lateral MOSFET, provided in said semiconductor substrate and connected in series with said vertical MOSFET, having second source, drain and gate electrodes, disposed on said first surface, and a back gate electrode provided on said second surface in common with said first drain electrode, said second source and gate electrodes being connected to said first source electrode to provide a connection node; and a zener diode, provided in said first surface, having an anode electrode, connected to said first gate electrode and formed in common with said second drain electrode to provide said second terminal, and a cathode electrode connected to said connection node.

2. The semiconductor overcurrent limiter according to claim 1, wherein said vertical and lateral MOSFETs have a depletion mode.

3. The semiconductor overcurrent limiter according to claim 1, wherein said lateral MOSFET has an on-resistance enough to obtain a voltage drop there across.

4. The semiconductor overcurrent limiter according to claim 1, wherein said vertical MOSFET has a first conductivity type while said lateral MOSFET has a second conductivity type opposite to said first conductivity type.

5. The semiconductor overcurrent limiter according to claim 1, wherein said zener diode has a breakdown voltage lower than that between gate and source regions of said lateral MOSFET.

6. The semiconductor overcurrent limiter according to claim 3, wherein an overcurrent is controlled by a voltage applied to said back gate electrode of said lateral MOSFET.

7. The semiconductor overcurrent limiter according to claim 1, wherein said vertical and lateral MOSFETs are provided in said first surface of said semiconductor substrate, while provided on said second surface thereof is a common electrode including said drain electrode of said vertical MOSFET and said back gate electrode of said lateral MOSFET.

8. A semiconductor overcurrent limiter having first and second terminals consisting essentially of:

a semiconductor substrate having first and second surfaces;

a vertical MOSFET, provided in said semiconductor substrate, having first source and gate electrodes, disposed on said first surface, and a first drain electrode disposed on said second surface to provide said first terminal;

a lateral MOSFET, provided in said semiconductor substrate and connected in series with said vertical MOSFET, having second source, drain and gate electrodes, disposed on said first surface, and a back gate electrode provided on said second surface in common with said first drain electrode, said second source and gate electrodes being connected to said first source electrode to provide a connection node; and a zener diode, provided in said first surface, having an anode electrode, connected to said first gate electrode and formed in common with said second drain electrode to provide said second terminal, and a cathode electrode connected to said connection node.

* * * * *